United States Patent [19]

Tseng

[11] Patent Number: 5,552,334
[45] Date of Patent: Sep. 3, 1996

[54] METHOD FOR FABRICATING A Y-SHAPED CAPACITOR IN A DRAM CELL

[75] Inventor: Horng-Huei Tseng, Hsinchu, Taiwan

[73] Assignee: Vanguard International Semiconductor Company, Hsin-Chu, Taiwan

[21] Appl. No.: 589,281

[22] Filed: Jan. 22, 1996

[51] Int. Cl.⁶ .............................. H01L 21/70; H01L 27/00
[52] U.S. Cl. .................. 437/52; 437/60; 437/919
[58] Field of Search .................. 437/47–48, 52, 437/60, 919; 257/306–310; 148/DIG. 14

[56] References Cited

U.S. PATENT DOCUMENTS

| | | | |
|---|---|---|---|
| 5,049,957 | 9/1991 | Inoue et al. | 437/52 |
| 5,084,405 | 1/1992 | Fazan et al. | 437/52 |
| 5,185,282 | 2/1993 | Lee et al. | 437/47 |
| 5,399,518 | 3/1995 | Sim et al. | 437/52 |
| 5,403,766 | 4/1995 | Miyake | 437/52 |
| 5,403,767 | 4/1995 | Kim | 437/52 |
| 5,443,993 | 8/1995 | Park et al. | 437/60 |

Primary Examiner—H. Jey Tsai

Attorney, Agent, or Firm—George O. Saile; William J. Stoffel

[57] ABSTRACT

The present invention provides a method of manufacturing a capacitor for a DRAM which uses one mask to define both the node contact hole and the bottom electrode. This novel one mask method uses lateral etch (e.g., oxygen plasma) to enlarge a first opening (the node contact opening) in the resist layer to define a slightly larger second opening which defines the storage electrode. This method reduces the masking steps used and therefore reduces process costs and increases yields. The process comprises forming an insulation layer and a resist layer having a first opening over an active area. A node contact hole is partially etched through the insulation layer. Next, the first opening is enlarged with an lateral etch to form a second slightly larger opening. A storage electrode hole is formed in the insulation layer with the same dimensions as the second opening and the node contact hole is extended to expose the node contact. The resist layer is removed. A polysilicon layer is formed that completely fills the node contact hole and coats the sidewalls of the storage electrode hole. Masking and etching steps form a Y-shaped storage electrode from the remaining first polysilicon layer coating the storage electrode hole.

27 Claims, 5 Drawing Sheets

METHOD FOR FABRICATING A Y-SHAPED CAPACITOR IN A DRAM CELL

BACKGROUND OF INVENTION

1. Field of the Invention

This invention relates generally to fabrication of capacitors in a DRAM cell and particularly to a method for fabricating stacked capacitors with large capacitance and more particularly to a method for fabricating a Y-shaped capacitor.

2. Description of the Prior Art

Very large scale integration (VLSI) semiconductor technologies have dramatically increased the circuit density on a chip. The miniaturized devices built in and on semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 $\mu m^2$ memory cell area employing an ordinal two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked. fin-structured, cylindrical, spread-stacked, and box structured capacitors.

The following US patents show related processes and capacitor structures: U.S. Pat. No. 5,399,518. Sim et al.; U.S. Pat. No. 5,403,767. Kirin U.S. Pat. No. 5,443,993, Park et al.; and U.S. Pat. No. 5,185,282, Lee et al. However, many of the prior an methods require substantially more processing steps or/and planar structures which make the manufacturing process more complex and costly.

There is a challenge to develop methods of manufacturing these capacitors that minimize the manufacturing costs and maximize the device yields. In particular, there is a challenge to develop a method which minimizes the number of photoresist masking operations and to provide maximum process tolerance to maximize product yields. There is also a challenge to develop a capacitor which is not limited in size by the photolithographic techniques.

SUMMARY OF THE INVENTION

It is an object of the present invention to provide a method for fabricating a capacitor which can over come the limitations of photographic techniques and which reduces the number of masking steps.

It is an object of the present invention to provide a method for fabricating a Y-shaped capacitor having a high density and capacitance.

It is an object of the present invention to provide a method for fabricating a dynamic random access memory. (DRAM) having capacitor having a high density and capacitance which is low cost and simple to manufacture.

To accomplish the above objectives, the present invention provides a method or manufacturing a capacitor for a dynamic random access memory. (DRAM) where one resist mask is used to define both the node contact hole and the bottom storage electrode. This inventive one mask method uses a lateral photoresist etch to enlarge a first opening (the node contact opening) in the resist layer to define a slightly larger second opening which defines the storage electrode. This method reduces the masking steps used and therefore reduces process costs and increases yields.

Briefly, the method comprises forming a first insulation layer and a resist layer having a first opening over an active area on a substrate. A node contact hole is etched partially through the insulation layer. Next, the first opening in the resist layer is enlarged with a lateral etch (e.g., an oxygen plasma treatment) to form a slightly larger second opening in the resist layer. The first insulation layer is anisotropically etched through the second opening. This etch forms a storage electrode hole in the insulation layer with the same dimensions as the second opening. The etch also extends the node contact hole to expose the node (e.g., source) on the substrate surface. The resist layer is then removed. A polysilicon layer is formed that completely fills the node contact hole and coats the sidewalls of the storage electrode hole and covers the top surface of the first insulation layer. A second insulation layer is formed over the polysilicon layer and completely fills the storage electrode forming a plug. The second insulation layer is etched away exposing the polysilicon layer but leaving the plug. Next, the first polysilicon layer on top of the first insulation is etched away. The plug and the first insulation layer are then selectively etched away thereby forming a Y-shaped storage electrode from the remaining first polysilicon layer. The capacitor is completed by forming a dielectric layer and a top electrode over the storage electrode.

This method reduces the masking steps used and therefore reduces process costs and increases yields. Also, the capacitor is smaller than possible using conventional photolithographic techniques.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a stacked capacitor which has small dimensions, high capacitance and is simple to manufacture. First, the process for forming the field oxide (FOX) and the field effect transistor structure as presently practiced in manufacturing DRAM cells are only briefly described in order to better understand the current invention. Second, the inventive method to fabricate the Y-shaped capacitor will be described in detail.

Figure 1:
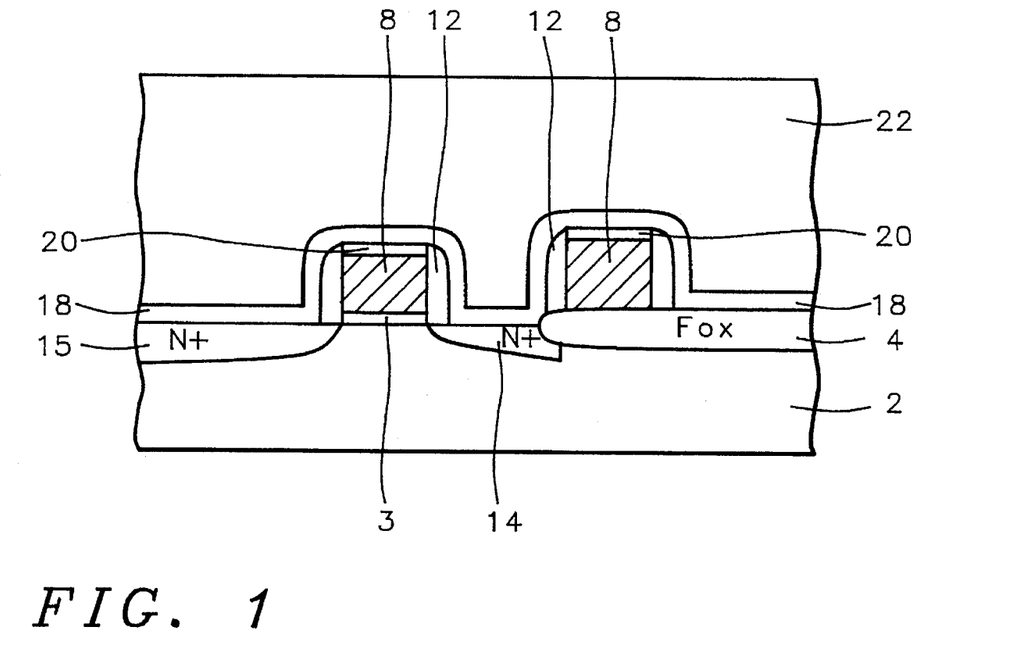
FIGS. 1, 2A–2C and 3 through 8 are cross sectional views for illustrating the method for manufacturing a DRAM having a stacked capacitor according to the present invention.

As shown in FIG. 1, the method begins by fabricating a capacitor in a substrate having a field oxide layer 4 and FET devices formed thereon. Field oxide layer 4 is formed on a semiconductor substrate 2 for defining active regions and isolation regions. The preferred substrate is composed of a P-type single crystal silicon having a (100) crystallographic orientation. A relatively thick field oxide (FOX) 4 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in the range of about 3000 to 6000 Å.

The semiconductor FET device is then formed in the active device area after removing the a silicon nitride barrier layer and the pad oxide in a conventional wet etch. The most commonly used device for dynamic random access memories (DRAMs) is a MOSFET device. This device is formed by first thermally oxidizing the active device area to form a thin gate oxide 3.

An appropriately doped polysilicon layer and an insulating layer are deposited on substrate 2 and conventional photolithographic techniques are used to pattern the gate oxide 3, polysilicon layer 8, and the insulating layer 20 which comprise the gate electrodes 3,8,20. Referring to FIG. 1, gate electrodes are formed over the field oxide layers 4 and are formed on the substrate disposed between sources 14 and drains 15. Gates on the substrate form the gate electrodes of the MOSFET in the active device areas. The gate electrodes formed over the field oxide regions 4 can form word lines that electrically connect the MOSFET gate electrode to the appropriate peripheral circuits on the DRAM chip. The doped source/drain regions 14, 15 of the N-channel MOSFET are preferably formed next, usually by implanting an N-type atomic species such as arsenic or phosphorus through the spaces between tile gate electrodes 8. For example, a typical implant for a lightly doped region might consist of phosphorus P31 at a dose of between about 1E13 to 1E14 atoms/cm$^2$ and at an energy between about 30 to 80 Key. Higher implant doses are often preferred.

After forming the doped source/drain regions 14 15, sidewall spacers 12 are formed on the gate electrode sidewalls. The sidewall spacers facing the source 14 are called inside sidewall spacers. The sidewall spacers 12 are formed by depositing a low temperature silicon oxide and anisotropically etching back to the silicon substrate surface. For example, the silicon oxide could be deposited by a chemical vapor deposition process using tetraethoxysilane (TEOS) at a temperature in the range of about 650° to 900° C. and the etch back performed in a low pressure reactive ion etcher.

The source/drain regions 14 15 of the MOSFET can be given an optional second implant between the spacers 12 with a N type atomic species, for example, arsenic (As75), to complete the source/drain (e.g., the source is the node contact). The implantation is can be done through a thin layer of silicon oxide of about 200 to 300 Å in thickness to minimize implant channeling and to protect against contamination by metals and other impurities. A typical implantation dose for a highly doped region is between 2E15 and 1E16 atoms/cm$^2$ and an energy of between about 20 and 70 Kev.

The remainder of this embodiment relates more specifically to those objects of the invention, which relate to the formation of the storage capacitor having a smaller size, an increased capacitance, and also reducing the masking operations.

As shown in FIG. 1, a first barrier layer 18 is formed over said substrate surface and said gate electrode. The barrier layer 18 is preferably formed of silicon nitride. The barrier layer 18 is preferably formed of silicon nitride having a thickness in the range of between about 500 to 1500 fit. Layer 18 functions as an etch barrier layer for a subsequent etch of layer 22 and is an optional layer.

A first insulation layer 22 then is formed over the first barrier layer 18. The first insulation layer is preferably formed of silicon oxide, doped silicon oxide, phosphosilicate glass, or borophosphosilicate glass (BPSG). The first insulation layer 22 is more preferably formed from borophosphosilicate glass. A borophosphosilicate glass layer can be formed by low pressure chemical vapor deposition (LPCVD) using tetraethylorthosilicate (TEOS) as a reactant. Boron and phosphorus are added to the ambient during the formation of the borophosphosilicate glass layer. The layer is thermally treated at a temperature of 850° C. for about 30 minutes to cause flow and planarization. The first insulation layer 22 has a thickness in the range of between about 5000 to 10,000 Å.

Figure 2A:
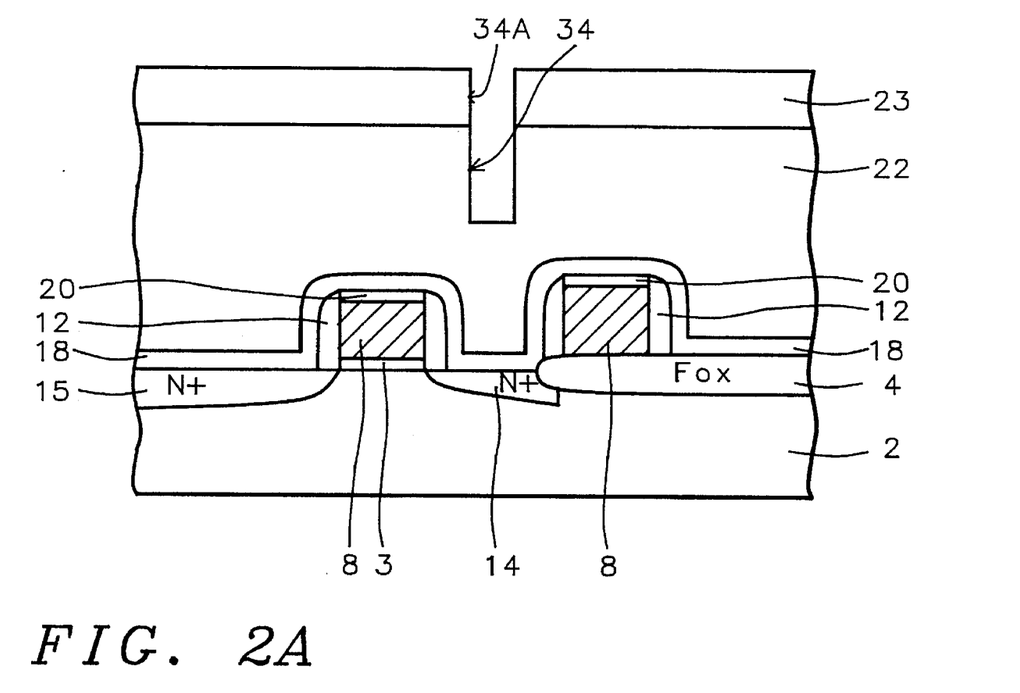

As shown in FIG. 2A, a resist layer 23 is formed over the first insulation layer 22. The resist layer has a first opening 34A (i.e., a contact node opening) over the source 14 or node. The first opening 34A has an open dimension in the range of between about 0.1 to 0.3 µm. For example, a squared shaped first opening could have an open dimension (length/width) between about 01. to 0.3 µm. The first opening can have any shape, such as a circular, rectangular or square shape. Preferably, the first opening 34A is the smallest size possible given the photo capabilities.

A first hole 34 is etched in the first insulation layer 22 defined by the first opening 34A in the resist layer. The first hole 34 extends partially through the first insulation layer 22. The first hole has a depth less than the thickness of the first insulation layer. The first hole 34 has a depth in the range of between about 2000 and 6000 Å.

A timed anisotropic etch is preferably used to etch the BPSG first insulation layer using O$_2$/CHF$_3$/CF$_4$ gas plasma. The etch can be performed in a Lam Research Co., model Rainbow 4500 etcher.

Figure 2B:
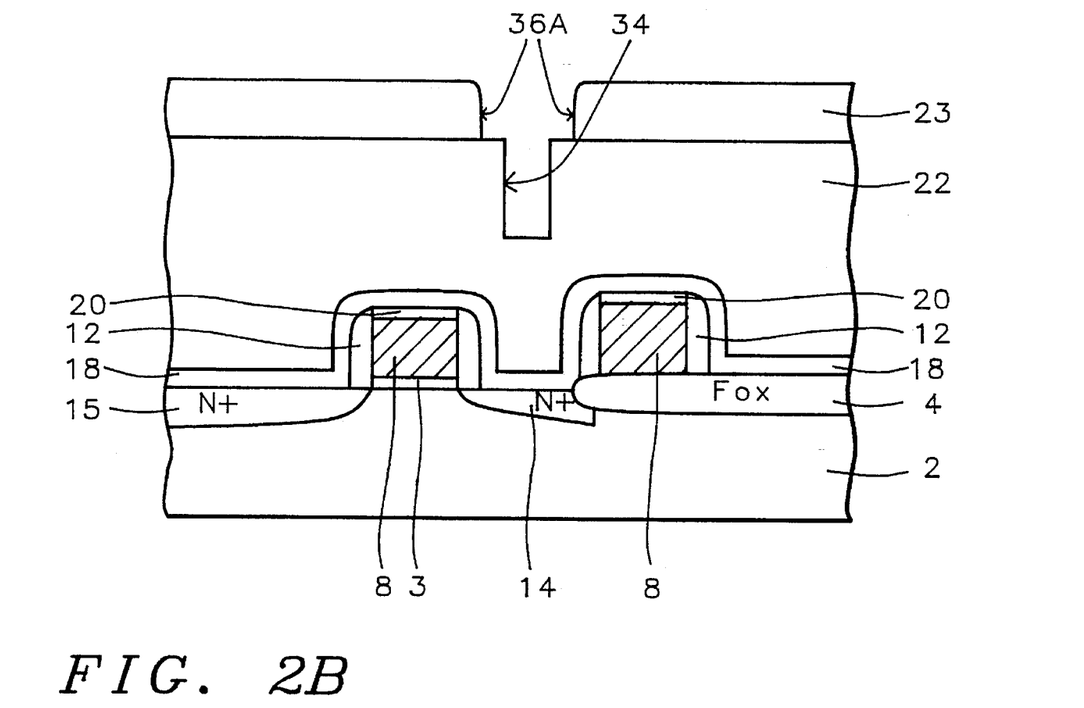

Turning to FIG. 2B, the resist layer 23 is laterally etched (e.g., removing a width of resist) thereby enlarging the first opening 34A in the resist layer 23 to form a second opening 36A over tile source 14. The second opening 36A can be concentric with the first hole and has a larger area than the first hole 34A. The photoresist layer 23 can be laterally etched by an oxygen plasma treatment performed in a barrel type photo resist striping tool. The etch is preferably a timed etch determined by the etch rate.

The lateral etch is preferably an O$_2$ plasma treatment performed in-situ in an oxide etch tool, such as a Lam Research Co., Rainbow 4500. The tool employs a low pressure electrical discharge to split molecular oxygen ($O_2$) into its more reactive atomic form (O ions). The oxygen ions then convert any organic compounds (such as residual photo resist other contamination) into gaseous products that can be pumped away. Most barrel reactors (such as a plasma stripper) operate in a pressure range of 0.5 to 1.0 torr and have external electrodes and a 13.56 MHz quartz power supply. The wafers can be stacked horizontally and surrounded by a shield to reduce the wafer exposure to the charged species in the plasma. In addition, a descum process can be used to clear organic and photoresist residue from contact holes before the plasma treatment. In addition to an oxygen plasma etch, any photoresist etch can be used that selectively removes photoresist.

The second opening 36A in the resist layer 23 preferably has an open dimension in the range of between about 0.2 and 0.6 μm.

Figure 2C:
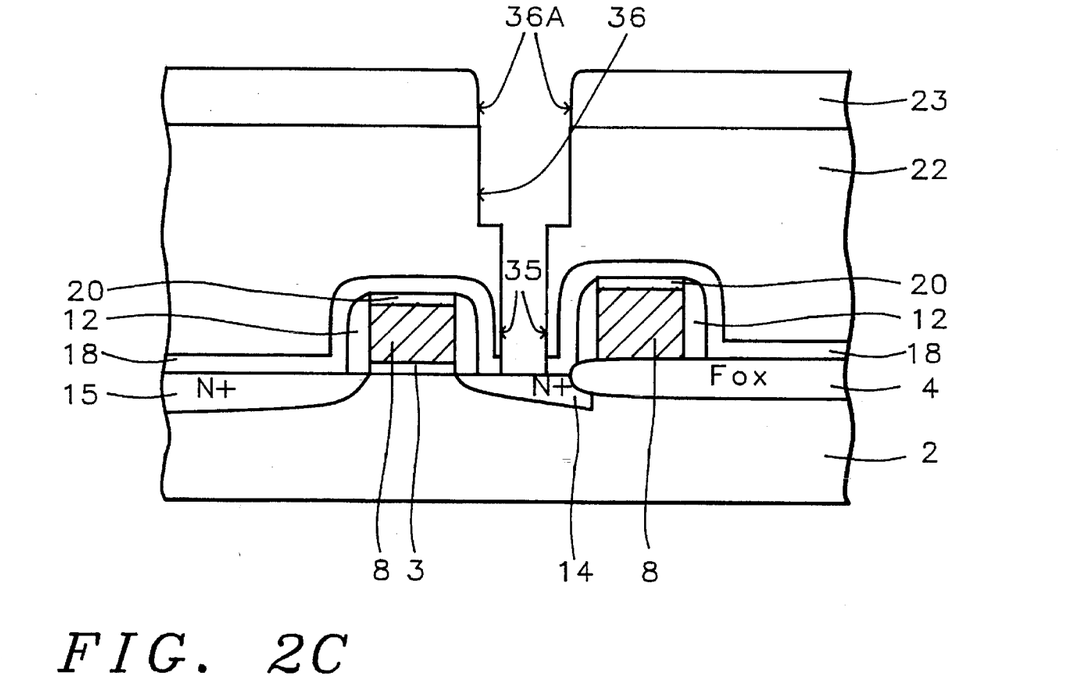

As shown in FIG. 2C, the first insulation layer 22 is anisotropically etched using the resist layer 23 as a mask. This extends the first hole 34A 35 through the first insulation layer to expose the source region 14. Also, the first insulation layer is etched through the second opening 36A thereby forming a second hole 36 (e.g., the storage electrode defining hole) into the first insulation layer to a depth less than the thickness of the first insulation layer. The second hole 36 (e.g., the storage electrode defining hole) is defined by sidewalls 36 of the first insulation layer 22. The second hole 36 preferably has a depth in the range of between about 2000 and 6000 Å.

A conventional dry etch, using an $O_2$/ $CHF_3$/$CF_4$ gas plasma, can be used to etch the BPSG first insulation layer. The etch can be controlled by an end point detection. The end point for the anisotropic is accurately determined by using optical emission spectroscopy and monitoring one the spectral lines of the etch by-product over the wafer in the plasma chamber, For example, one can monitor the spectral emission of the silicon fluoride (SiF) by-product having a spectral wavelength of 4050 Å. The technique relies on the change in the emission intensity of the characteristic spectral line as the etched surface changes from one type of material to another. In this way the end point can be accurately detected when the first insulation layer ($SiO_2$) is etched to the substrate 2. The etch process is then terminated, This provides a means for etching accurately from wafer to wafer and run process run to process run making a more manufacturable process.

The resist layer 23 is then removed. This can be done in an $O_2$ plasma photoresist stripper.

Figure 3:
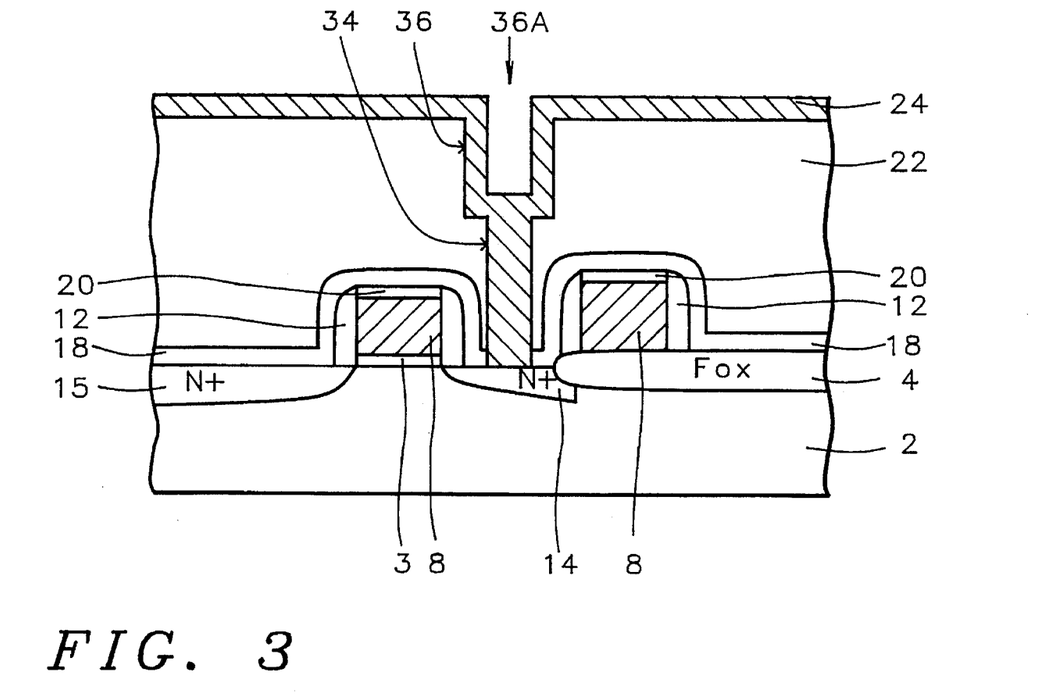

As displayed in FIG. 3, a first polysilicon layer 24 is formed which completely fills the first hole 34A, coats the sidewalls 36 of the second hole 36, and covers the top surface of the first insulation layer 22. The first polysilicon layer is preferably formed of polycrystalline silicon being doped with conductive impurities, such as As or P, with impurity concentrations in the range of between about 1E20 to 1E22 atoms/cm$^3$ and preferably has a thickness in the range of between about 500 to 1500 Å.

Figure 4:
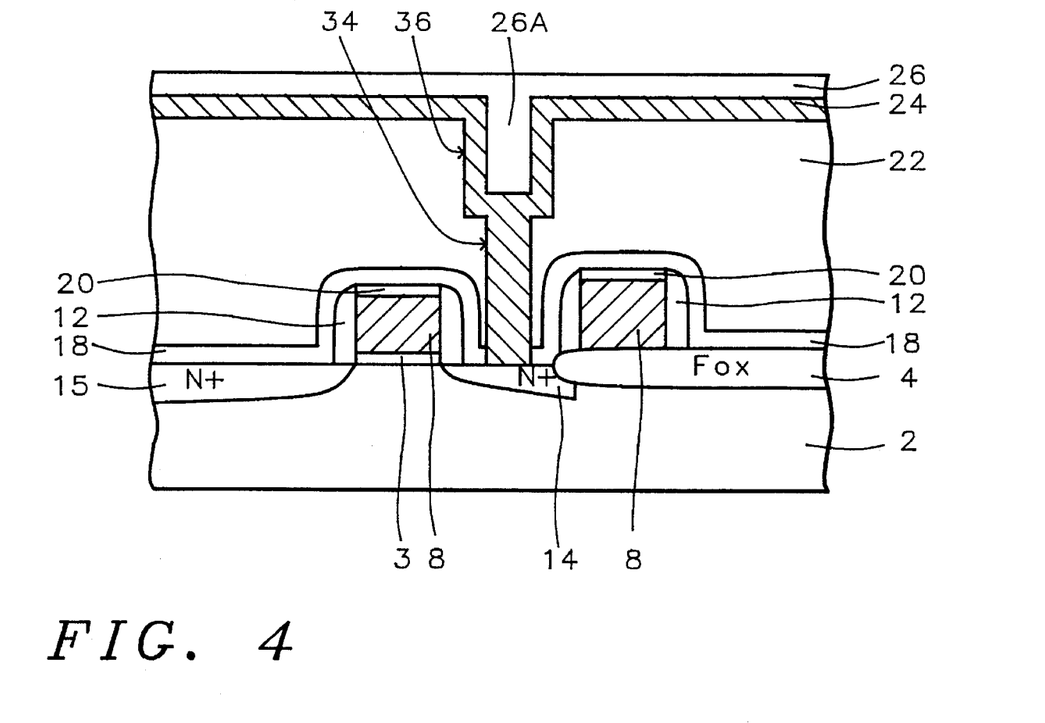

FIG. 4 shows a second insulation layer 26 is formed over the polysilicon layer 24 which completely fills the second hole 36 thus forming a plug 26A in the second opening 36. The second insulation layer is preferably formed of undoped silicon oxide, doped silicon oxide such as borophosilicate glass (BPSG), or phosphosilicate glass (PSG). The second insulation layer 26 has a thickness in the range of between about 500 to 2000 Å. The second insulation layer 26 can be formed by conventional chemical vapor deposition processes. The plug 26A acts as a mask for a subsequent etch of the polysilicon layer 24.

Figure 5:
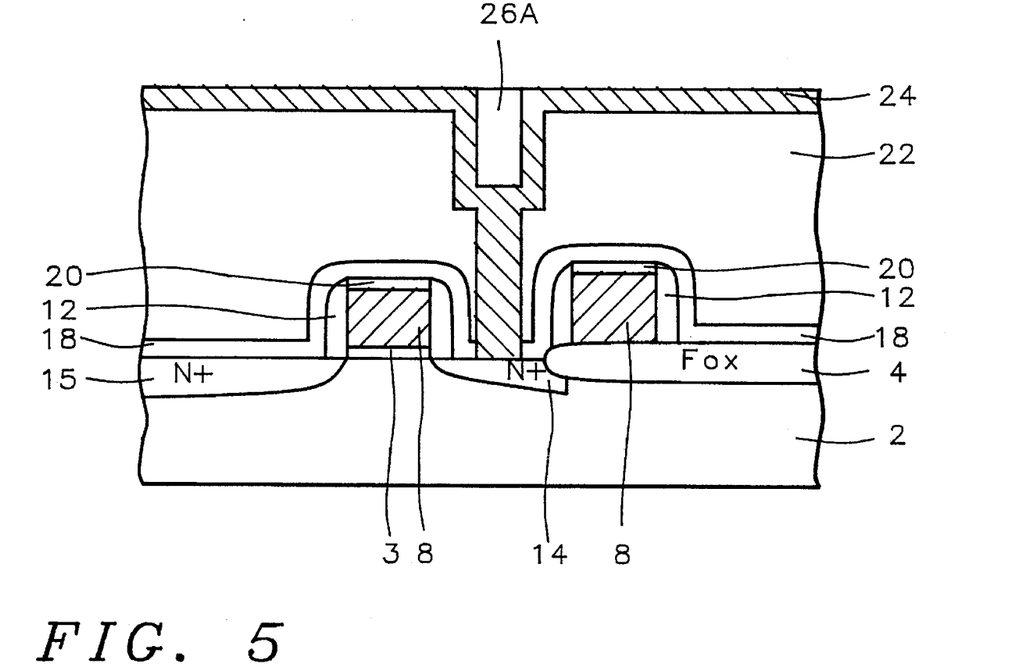

As shown in FIG. 5, the second insulation layer 26 is then etched thereby removing the second insulation layer on the top of the polysilicon layer 24 thus exposing the first polysilicon layer and the plug 26A. The second insulation layer 26, composed of silicon oxide, is preferably anisotropically etched back using an $O_2$/$CHF_3$/$CF_4$ gas plasma.

Figure 6:
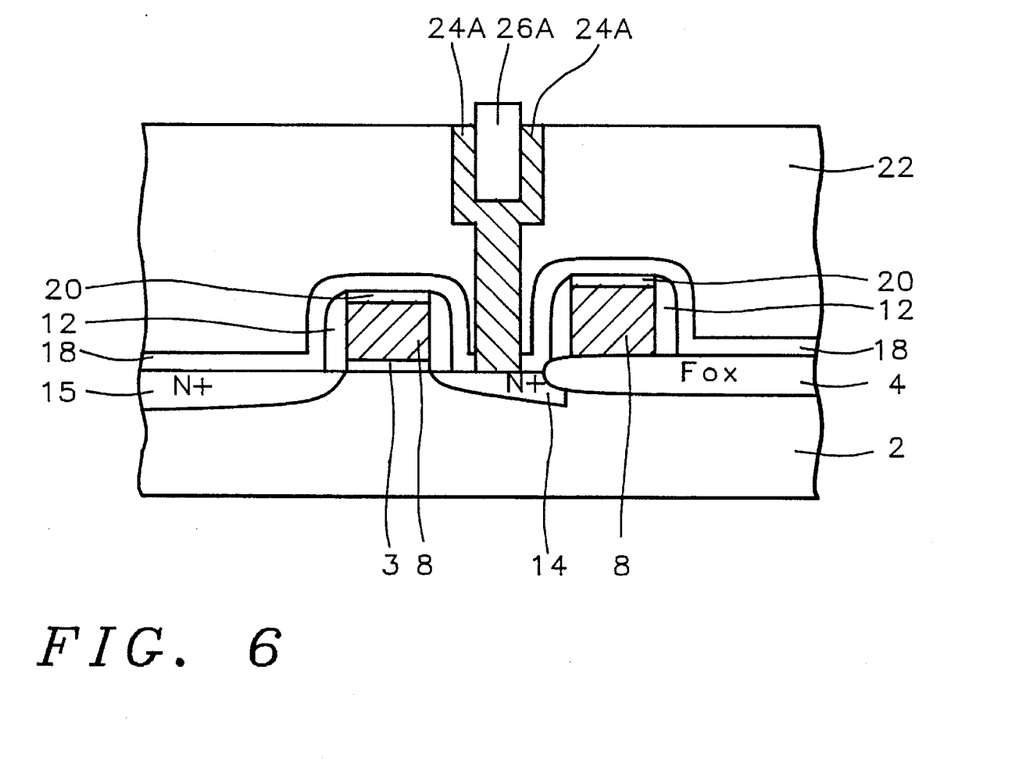

As shown in FIG. 6, the first polysilicon layer 24 on the top of the first insulation layer 22 is etched thereby exposing the first insulation layer 22. A plasma dry etch using HBr/$Cl_2$ gas plasma is preferably used. The etch preferably has a high selectivity (>20) of polysilicon to $SiO_2$.

Figure 7:
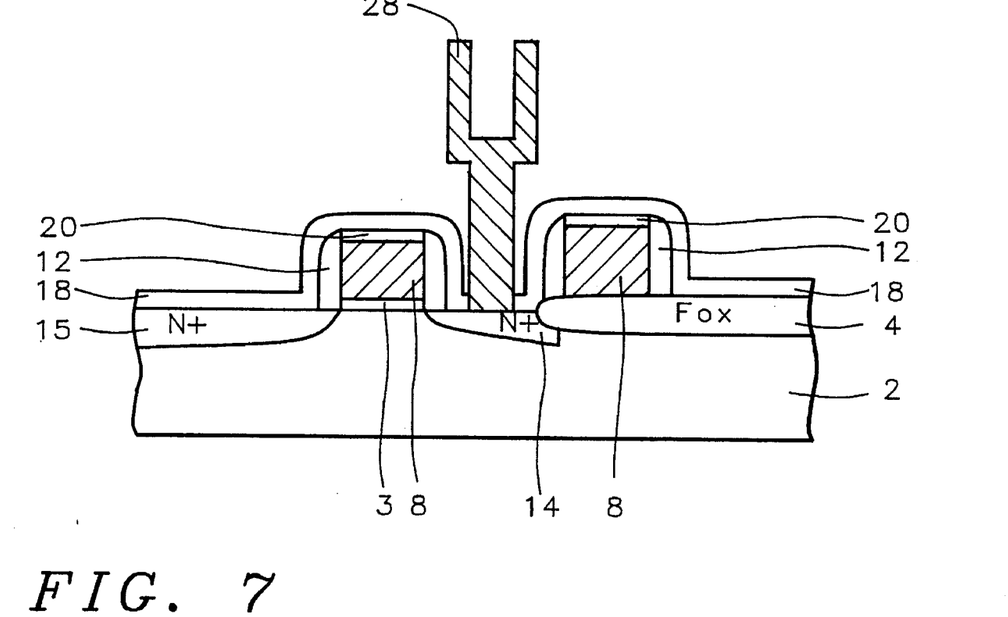

Referring to FIG. 7, the plug 26A and the first insulation layer 22 are isotropically etched thereby forming a Y-shaped storage electrode 28 from the remaining first polysilicon layer 24A. A wet etching process can be performed with a surfactant buffered oxide etchant (SBOE), which is a material produced by adding a surface active agent to a mixture of $NH_4F$ and HE for one to two minutes. The etch selectively etches the silicon oxide layers over the polysilicon layer. The barrier layer 18 can act as an etch stop layer because of the etch selectivity of oxide to silicon nitride. Ira barrier layer 18 is not formed, then the first insulation layer 22 can be partially etched back to preserve the underlying layers 20 12.

Figure 8:
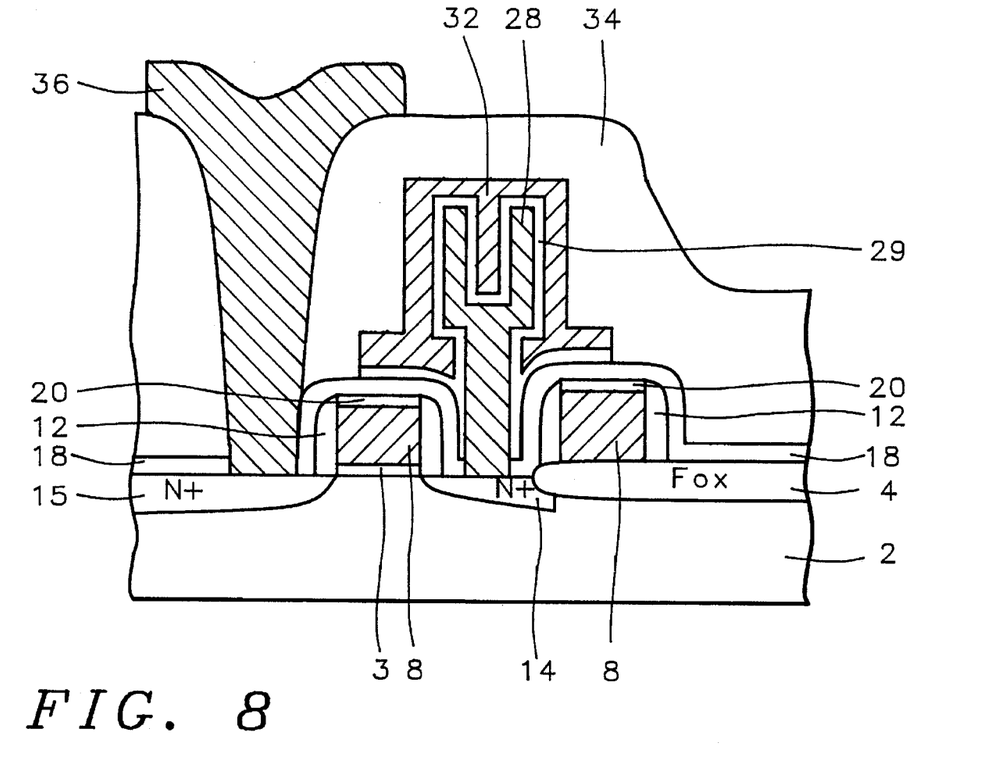

As shown in FIG. 8, a capacitor dielectric layer 29 is formed over the storage electrode 28. The material of the dielectric layer 29 can be any suitable material having a high dielectric constant, being continuous and pinhole free. The conformal dielectric layer 29 is preferably formed of silicon nitride, an oxide/nitride/oxide (ONO) film, tantalum pentoxide ($Ta_2O_5$) or silicon oxide material. Preferably, the conformal dielectric layer is formed of ONO. The conformal dielectric layer 29 preferably has a thickness in the range between about 10 and 100 Å.

A top electrode 32 is formed over the dielectric layer by the processes shown in FIG. 8. This is accomplished by forming a doped conductive layer over the substrate surface. A polysilicon layer can be formed and doped in situ or alternately ion implanted with impurities to obtain the proper doping level. The doped conductive layer is masked and etched, using conventional photolithographic techniques, to form the top plate electrode 32. The top electrode preferably has a thickness in the range between about 1000 to 2000 Å. The top plate electrode is preferably formed a polycrystalline silicon doped with an impurity. The top plate electrode/third conductive layer preferably has an impurity concentration in the range of between about 1E19 to 1E22 atoms/cm$^3$.

A top insulation layer 34 is then formed over the top plate electrode 32. The top insulation layer 34 is preferably formed of silicon oxide, doped silicon oxide, or BPSG. The top insulation layer 34 is preferably formed of borophosphosilicate glass (BPSG) and can have a thickness in the range of between about 3000 and 6000 Å and more preferably about 5000 Å.

As shown in FIG. 8, a bit line opening is then formed thorough the layers overlying the drain 15, such as the top insulation layer 34, and the barrier layer 18, to expose the doped region 15. A doped polysilicon layer and an overlying polycide layer (optional) is preferably formed over the bit contact opening and makes electrical contact with the doped region (e.g., drain) 15. The doped polysilicon layer is patterned to form the bit line contact 36.

This process of the present invention provides a novel method of defining both the node contact hole 34 and the storage electrode hole 36 using only one resist mask 23. The contact node opening 34A in the first resist mask 23 is enlarged by a lateral etch thereby creating a second opening 36A that defines the storage electrode. This novel process reduces the masking steps used and therefore reduces process costs and increases yields. Saving one masking step can result in an about 5% cost saving since 16 MB DRAM process typically employ about 22 masking steps. The plasma treatment also allows the upper portion of the Y-shaped storage electrode to be formed smaller (narrower) than the photolithographic resolution thereby increasing the capacitance per unit area and allowing the memory cell to be further miniaturized.

While the invention has been particularly shown and described with reference to the preferred embodiments thereof it will be understood by those skilled in the art that various changes in form and details may be made without departing from the spirit and scope of the invention.

What is claimed is:

1. A method of manufacturing a Y-shaped capacitor for a memory device, comprising the steps of:

forming a first insulation layer over a substrate;

forming a resist layer over said first insulation layer, said resist layer having a first opening, etching a node contact hole defined by said first opening in said first insulation layer, said node contact hole extending partially through said first insulation layer, said node contact hole having a depth less than a thickness of said first insulation layer;

laterally etching said resist layer thereby enlarging said first opening in said resist layer to form a second opening over said node contact hole, said second opening having a larger area than said node contact hole;

anisotropically etching said first insulation layer using said etched resist layer as a mask and extending said node contact hole through said first insulation layer to expose said substrate, and etching said first insulation layer through said second opening thereby forming a storage electrode hole into said first insulation layer to a depth less than the thickness of said first insulation layer, said storage electrode hole being defined by sidewalls of said first insulation layer;

removing said resist layer;

forming a first polysilicon layer completely filling said extended node contact hole and coating sidewalls of said storage electrode hole and a top surface of said first insulation layer;

forming a second insulation layer over the first polysilicon layer thereby completely filling said storage electrode hole forming a plug in said storage electrode hole;

removing said second insulation layer exposing said first polysilicon layer and said plug;

etching back said exposed first polysilicon layer thereby exposing said first insulation layer;

selectively etching said plug and said first insulation layer thereby forming a Y-shaped storage electrode from remaining portions of said first polysilicon layer; and forming a dielectric layer and a top electrode over said Y-shaped storage electrode thereby completing said Y-shaped capacitor.

2. The method of claim 1 wherein said substrate further includes a first barrier layer over a substrate surface, said first barrier layer formed of silicon nitride having a thickness in a range between 500 and 1500 Å.

3. The method of claim 1 wherein first insulation layer is formed from borophosphosilicate glass and has a thickness in a range of between about 5000 and 10,000 Å.

4. The method of claim 1 wherein said first opening has an open dimension in a range of between about 0.1 and 0.3 µm.

5. The method of claim 1 wherein said node contact hole which extends partially through said first insulation layer has a depth in a range of between about 2000 and 6000 Å.

6. The method of claim 1 wherein said lateral etch of said resist layer is performed using an oxygen plasma.

7. The method of claim 1 wherein said second opening has an open dimension in a range of between about 0.2 and 0.6 µm.

8. The method of claim 1 wherein said storage electrode hole has a depth in a range of between about 2000 and 6000 Å.

9. The method of claim 1 wherein said first polysilicon layer is formed of polycrystalline silicon being doped with conductive impurities with impurity concentrations in a range of between about 1E20 and 1E22 atoms/cm$^3$ and has a thickness in a range of between about 500 and 1500 Å.

10. The method of claim 1 wherein said dielectric layer is formed of a layer of silicon oxide, a layer of silicon nitride, and a layer of silicon oxide (ONO) and said dielectric layer has a total thickness in a range between about 10 to 100 Å.

11. The method of claim 1 wherein said top electrode has a thickness in a range between about 1000 to 2000 Å and a dopant concentration in a range of between about 1E19 and 1E22 atoms/cm$^3$.

12. A method of fabricating a dynamic random access memory (DRAM) cell having Y-shaped capacitor, comprising the steps of:

forming a MOS (metal oxide semiconductor) device having source and drain regions, adjacent to a field oxide region, in a silicon substrate;

forming a conductive word line over said field oxide region;

forming a first barrier layer over said MOS device and said field oxide region;

forming a first insulation layer over said first barrier layer;

forming a resist layer over said first insulation layer, said resist layer having a first opening over said source region;

etching a first hole defined by said first opening in said first insulation layer, said first hole extends partially through said first insulation layer, said first hole having a depth less than a thickness of said first insulation layer;

laterally etching said resist layer thereby enlarging said first opening in said resist layer to form a second opening over said source region, said second opening being concentric with said first hole and having a larger area than said first hole;

anisotropically etching said first insulation layer using said etched resist layer as a mask and extending said first hole through said first insulation layer to expose said source region, and etching said first insulation layer through said second opening thereby forming a second hole into said first insulation layer to a depth less than a thickness of said first insulation layer, said second hole being defined by sidewalls of said first insulation layer;

removing said resist layer;

forming a first polysilicon layer completely filling said extended first hole and coating sidewalls of said second hole and a top surface of said first insulation layer;

forming a second insulation layer over the first polysilicon layer thereby completely filling said second hole forming a plug in said second opening;

removing said second insulation layer exposing said first polysilicon layer and said plug;

etching back said exposed first polysilicon layer thereby exposing said first insulation layer;

selectively etching said plug and said first insulation layer thereby forming a Y-shaped storage electrode from remaining portions of said first polysilicon layer;

forming a dielectric layer and a top electrode over said Y-shaped storage electrode, and forming an top insulation layer over said silicon substrate thereby completing said DRAM cell.

13. The method of claim 12 wherein said first barrier layer is formed of silicon nitride having a thickness in a range of between about 500 and 1500 Å.

14. The method of claim 12 wherein first insulation layer is formed from borophosphosilicate glass and has a thickness in a range of between about 5000 and 10,000 Å.

15. The method of claim 12 wherein said first opening has an open dimension in a range of between about 0.1 and 0.3 µm.

16. The method of claim 12 wherein said first hole which extends partially through said first insulation layer has a depth in a range of between about 2000 and 6000 Å.

17. The method of claim 12 wherein said lateral etch of said resist layer is performed using an oxygen plasma.

18. The method of claim 12 wherein said second opening has an open dimension in a range of between about 0.2 and 0.6 µm.

19. The method of claim 12 wherein said second hole has a depth in a range of between about 2000 and 6000 Å.

20. The method of claim 12 wherein said first polysilicon layer is formed of polycrystalline silicon being doped with conductive impurities with impurity concentrations in a range of between about 1E20 and 1E22 atoms/cm$^3$ and has a thickness in a range of between about 500 and 1500 Å.

21. The method of claim 12 wherein said dielectric layer is formed of a layer of silicon oxide, a layer of silicon nitride, and a layer of silicon oxide (ONO) and said dielectric layer has a total thickness in a range between about 10 and 100 Å.

22. The method of claim 12 wherein said top electrode has a thickness in a range between about 1000 to 2000 and a dopant concentration in a range of between about 1E19 and 1E22 atoms/cm$^3$.

23. A method of fabricating a dynamic random access memory (DRAM) cell having Y-shaped capacitor, comprising the steps of:

forming a MOS (metal oxide semiconductor) device having source and drain regions, adjacent to a field oxide region, in a silicon substrate;

forming a conductive word line over said field oxide region;

forming a first barrier layer composed of silicon nitride over said MOS device and said field oxide region:

forming a first insulation layer composed of borophosphosilicate glass over said first barrier layer;

forming a resist layer over said first insulation layer, said resist layer having a first opening over said source, said first opening having an open dimension between about 0.1 and 0.3 µm;

etching a node contact hole defined by said first opening in said first insulation layer, said node contact hole extending partially through said first insulation layer, said node contact hole having a depth less than a thickness of said first insulation layer, said node contact hole having a depth in a range of between about 2000 and 6000 Å;

laterally etching said resist layer using an oxygen plasma etch thereby enlarging said first opening in said resist layer to form a second opening over said source region, said second opening being concentric with said node contact hole and having a larger area than said node contact hole, said second opening has an open dimension in the range of between about 0.2 and 0.6 µm;

anisotropically etching said first insulation layer using said etched resist layer as a mask and extending said node contact hole through said first insulation layer to expose said source region, and etching said first insulation layer through said second opening thereby forming a storage electrode hole into said first insulation layer to a depth less than the thickness of said first insulation layer, said storage electrode hole has a depth in a range of between about 2000 and 6000 Å, said storage electrode hole being defined by sidewalls of said first insulation layer;

removing said resist layer;

forming a first polysilicon layer completely filling said extended node contact hole and coating said sidewalls of said storage electrode hole and a top surface of said first insulation layer;

forming a second insulation layer over the first polysilicon layer thereby completely filling said storage electrode hole forming a plug in said storage electrode hole;

removing said second insulation layer exposing said first polysilicon layer and said plug;

etching said exposed first polysilicon layer thereby exposing said first insulation layer;

selectively etching said plug and said first insulation layer thereby forming a Y-shaped storage electrode from remaining portions of said first polysilicon layer;

forming a dielectric layer and a top electrode over said Y-shaped storage electrode, and forming an top insulation layer over said silicon substrate thereby completing said DRAM cell.

24. The method of claim 23 wherein said first barrier layer has a thickness in a range of between about 500 and 1500 Å.

25. The method of claim 23 wherein first insulation layer has a thickness in a range of between about 5000 and 10,000 Å.

26. The method of claim 23 wherein said first polysilicon layer is formed of polycrystalline silicon being doped with conductive impurities with impurity concentrations in a range of between about 1E20 and 1E22 atoms/cm$^3$ and has a thickness in a range of between about 500 and 1500 Å.

27. The method of claim 23 wherein said dielectric layer is formed of a layer of silicon oxide, a layer of silicon nitride, and a layer of silicon oxide (ONO) and said dielectric layer has a total thickness in a range between about 10 to 100 Å.

* * * * *